US011877393B2

(12) United States Patent
Park et al.

(10) Patent No.: US 11,877,393 B2
(45) Date of Patent: Jan. 16, 2024

(54) STRETCHABLE CIRCUIT SUBSTRATE

(71) Applicant: LG INNOTEK CO., LTD., Seoul (KR)

(72) Inventors: Duck Hoon Park, Seoul (KR); Woo Young Chang, Seoul (KR); Jee Heum Paik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 286 days.

(21) Appl. No.: 17/604,005

(22) PCT Filed: Feb. 26, 2020

(86) PCT No.: PCT/KR2020/002714
§ 371 (c)(1),
(2) Date: Oct. 15, 2021

(87) PCT Pub. No.: WO2020/218726
PCT Pub. Date: Oct. 29, 2020

(65) Prior Publication Data
US 2022/0217840 A1 Jul. 7, 2022

(30) Foreign Application Priority Data
Apr. 24, 2019 (KR) ........................ 10-2019-0047803

(51) Int. Cl.
*H05K 1/02* (2006.01)
*G06F 3/041* (2006.01)
(Continued)

(52) U.S. Cl.
CPC ......... *H05K 1/0283* (2013.01); *G06F 3/0412* (2013.01); *G09F 9/301* (2013.01);
(Continued)

(58) Field of Classification Search
CPC ............................ H05K 1/0283; H05K 1/189
See application file for complete search history.

(56) References Cited

U.S. PATENT DOCUMENTS 10,164,208 B2 12/2018 Lee et al.
10,274,767 B2 4/2019 Ohara
(Continued)

FOREIGN PATENT DOCUMENTS

| CN | 107278024 | 10/2017 |
|----|-----------|---------|
| CN | 107960004 | 4/2018 |

(Continued)

OTHER PUBLICATIONS

International Search Report dated Jun. 10, 2020 issued in Application No. PCT/KR2020/002714.
(Continued)

*Primary Examiner* — Sherman Ng
(74) *Attorney, Agent, or Firm* — KED & ASSOCIATES, LLP

(57) ABSTRACT

A stretchable circuit board according to an embodiment comprises: a substrate including one surface and the other surface opposite to the one surface; an electronic component disposed on the one surface of the substrate; and a wiring electrode disposed on the one surface of the substrate and connecting the electronic component, wherein the substrate includes an effective area, in which the electronic component is formed, and an ineffective area other than the effective area and includes a pattern part which is formed in the ineffective area and extends through the substrate from one surface to the other surface thereof.

19 Claims, 12 Drawing Sheets

(51) Int. Cl.

| | | |
|---|---|---|
| *G09F 9/30* | (2006.01) | |
| *H05K 1/18* | (2006.01) | |
| *H01L 23/538* | (2006.01) | |
| *H10K 77/10* | (2023.01) | |
| *H01L 23/498* | (2006.01) | |
| *H01L 23/495* | (2006.01) | |
| *H10K 102/00* | (2023.01) | |

(52) U.S. Cl.
CPC ... *H05K 1/189* (2013.01); *G06F 2203/04102* (2013.01); *H01L 23/4985* (2013.01); *H01L 23/49572* (2013.01); *H01L 23/5387* (2013.01); *H10K 77/10* (2023.02); *H10K 77/111* (2023.02); *H10K 2102/311* (2023.02)

(56) References Cited

U.S. PATENT DOCUMENTS

| | | | |
|---|---|---|---|
| 10,499,496 B2 | 12/2019 | Li et al. | |
| 10,505,147 B2 | 12/2019 | Lee | |
| 11,246,212 B2 | 2/2022 | Li et al. | |
| 2002/0094701 A1* | 7/2002 | Biegelsen | B25J 13/084 439/32 |
| 2008/0257586 A1* | 10/2008 | Chen | H05K 1/0283 29/829 |
| 2009/0317639 A1* | 12/2009 | Axisa | H05K 1/0283 428/411.1 |
| 2010/0330338 A1 | 12/2010 | Boyce et al. | |
| 2015/0065840 A1 | 3/2015 | Bailey | |
| 2015/0189736 A1* | 7/2015 | Yang | H05K 1/0283 361/749 |
| 2016/0105950 A1 | 4/2016 | Drzaic et al. | |
| 2017/0005077 A1* | 1/2017 | Kim | G02B 6/0068 |
| 2018/0027651 A1* | 1/2018 | Lim | H01L 21/4821 361/749 |
| 2018/0088390 A1 | 3/2018 | Ohara | |
| 2018/0110118 A1 | 4/2018 | Li et al. | |
| 2019/0306974 A1 | 10/2019 | Li et al. | |
| 2019/0327829 A1 | 10/2019 | Ogura et al. | |

FOREIGN PATENT DOCUMENTS

| | | |
|---|---|---|
| CN | 207911124 | 9/2018 |
| CN | 109076696 | 12/2018 |
| JP | 05-015020 | 2/1993 |
| JP | 05-327135 | 12/1993 |
| JP | 2000-082868 | 3/2000 |
| JP | 2008-211053 | 9/2008 |
| JP | 2018-054675 | 4/2018 |
| KR | 10-2016-01449 12 | 12/2016 |
| KR | 10-2017-00959 38 | 8/2017 |
| KR | 10-2018-00790 91 | 7/2018 |

OTHER PUBLICATIONS

Chinese Office Action dated Apr. 22, 2023 issued in Application No. 202080030069.2.

\* cited by examiner

[FIG. 1]
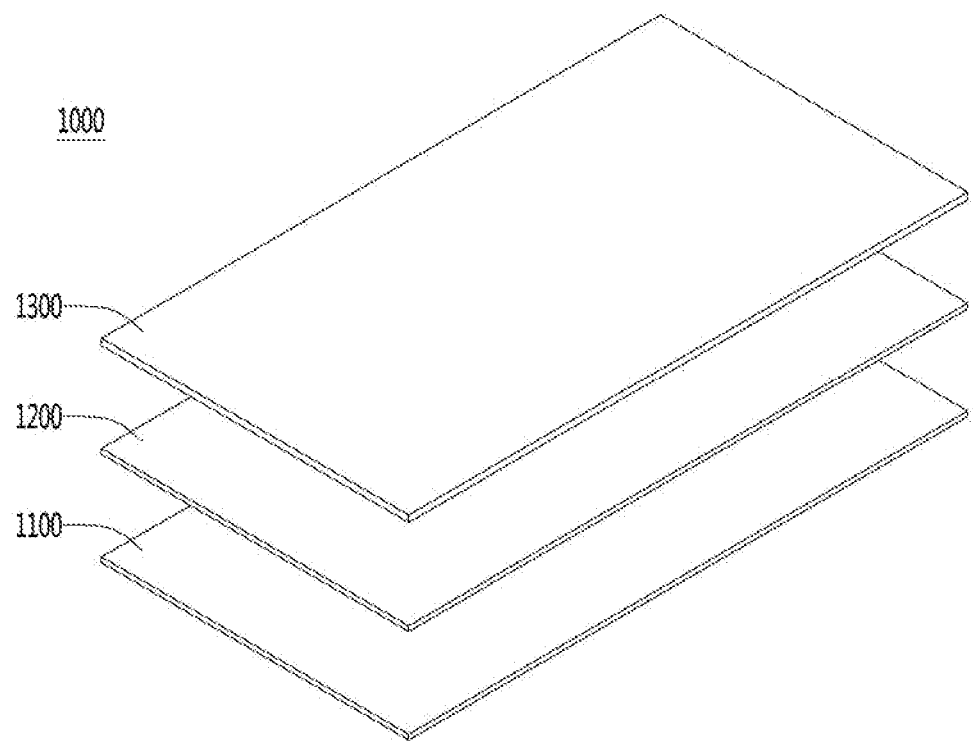
[FIG. 2]
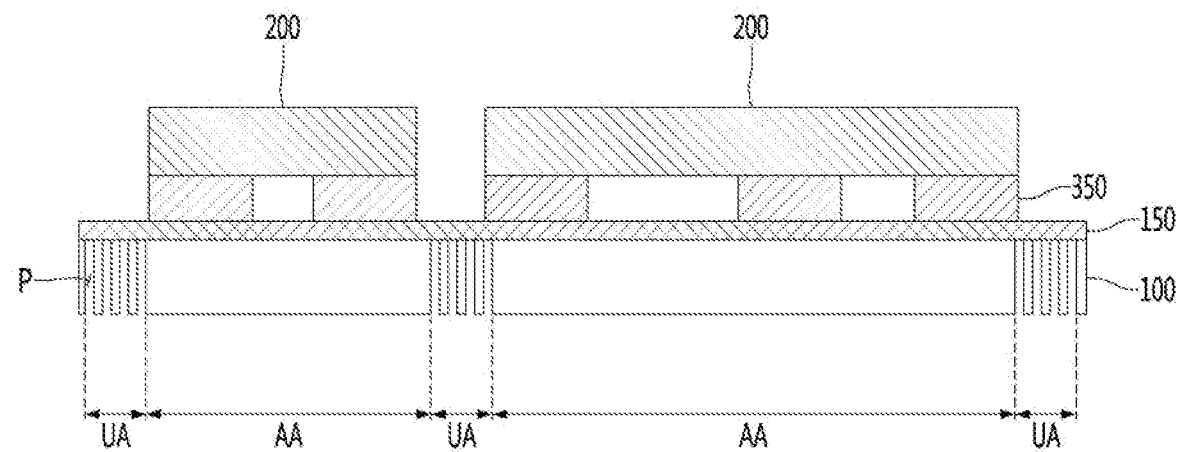

[FIG. 3]
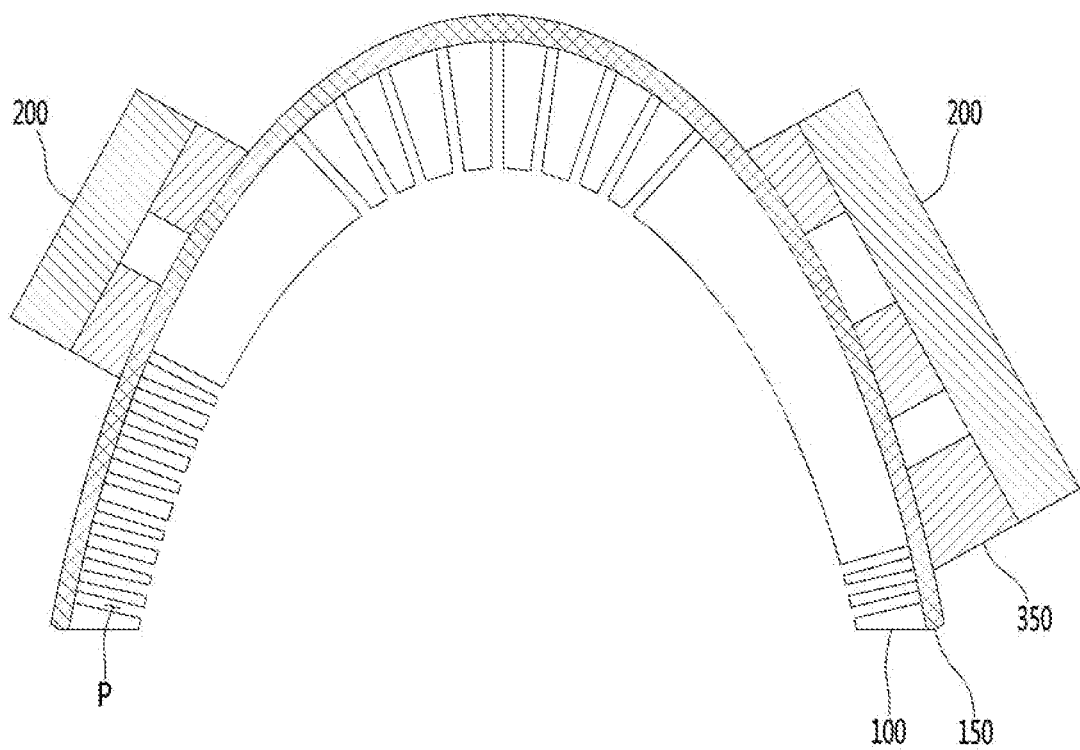

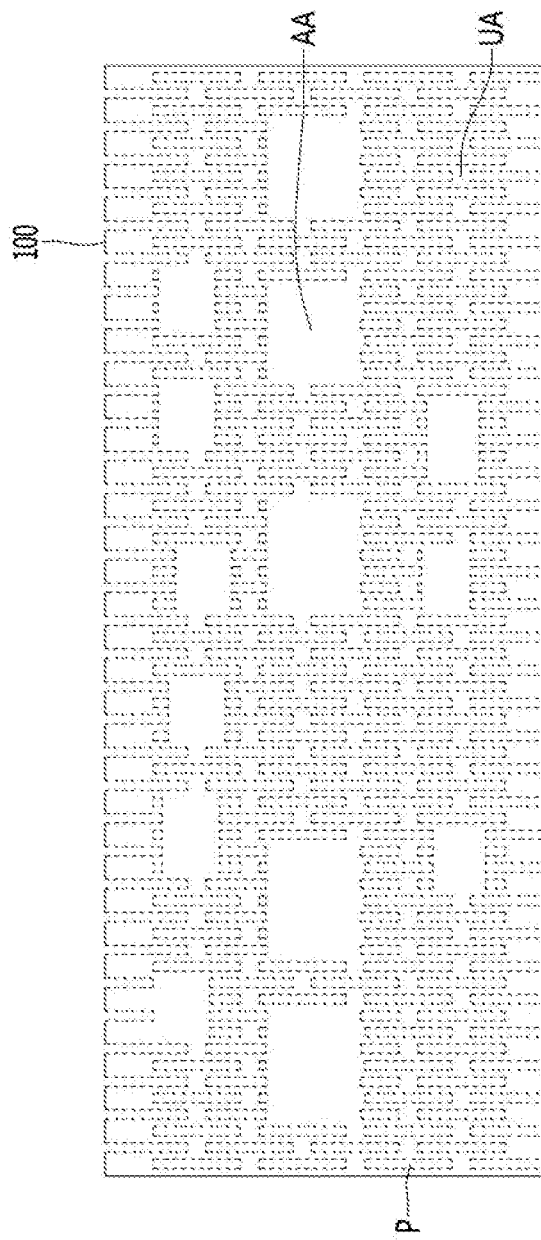
[FIG. 4]

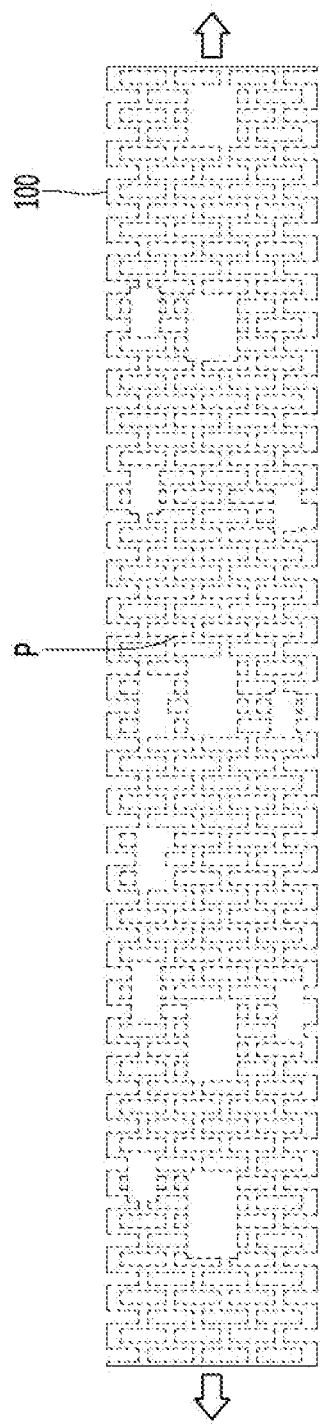
[FIG. 5]

[FIG. 6]
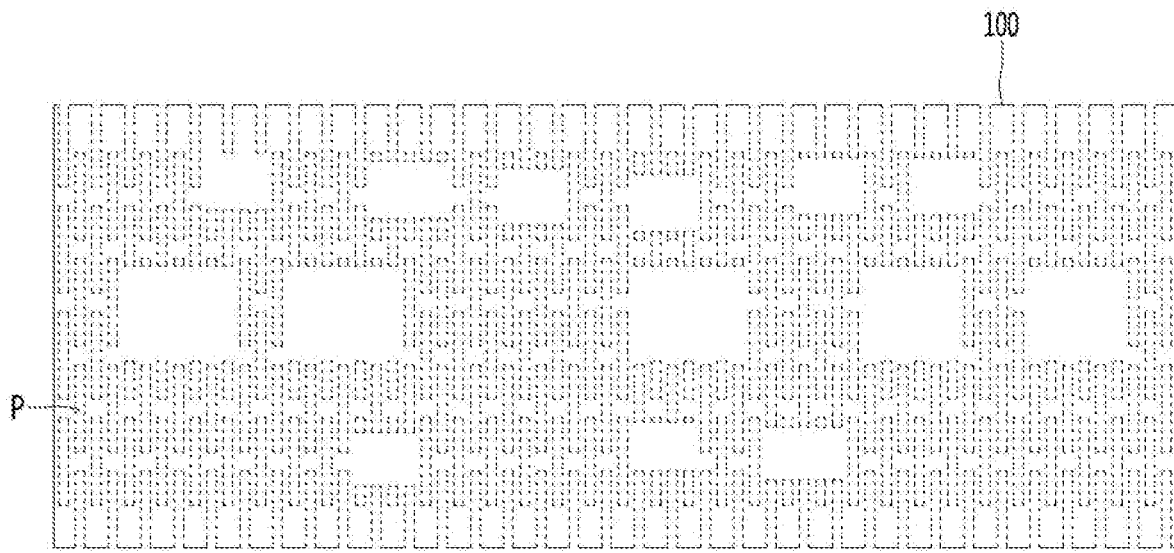
[FIG. 7]
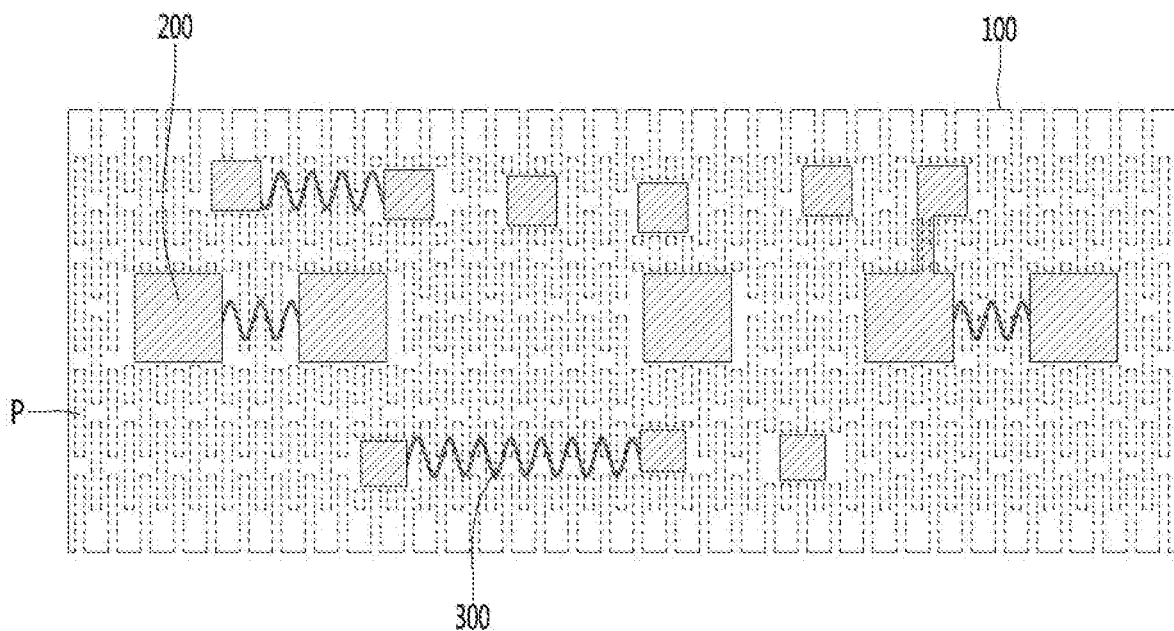

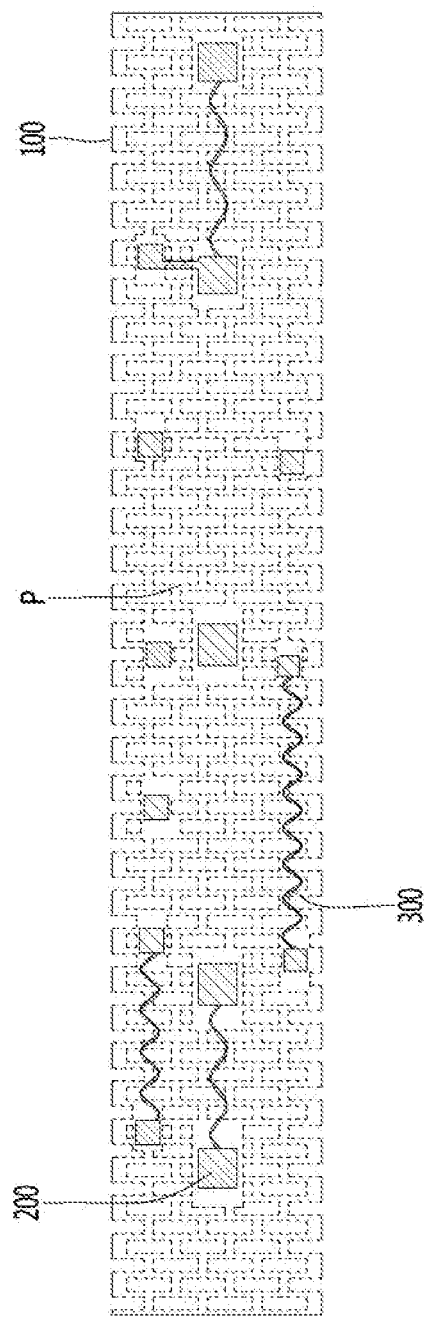
[FIG. 8]

[FIG. 9]
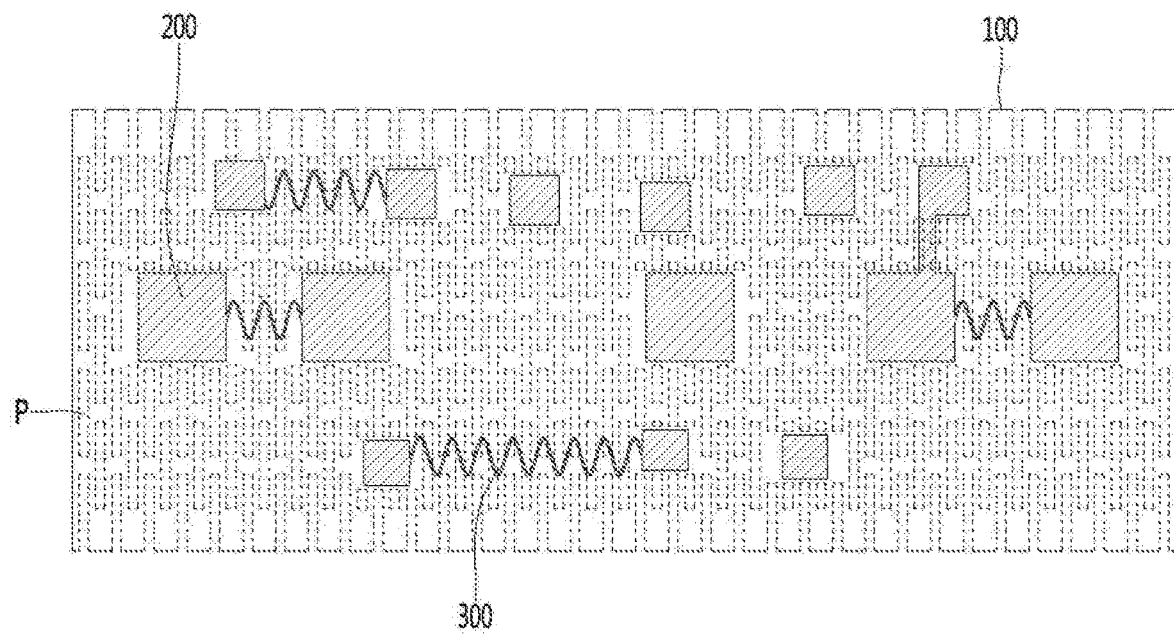
[FIG. 10]
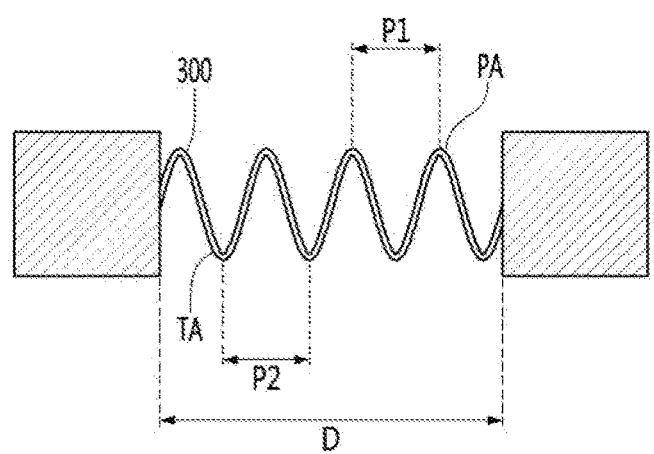

[FIG. 11]
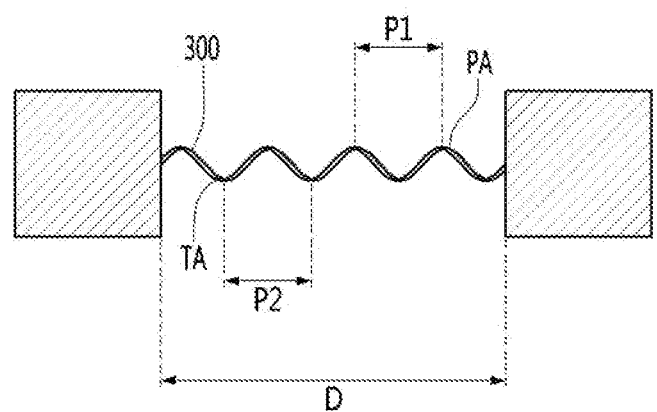
[FIG. 12]
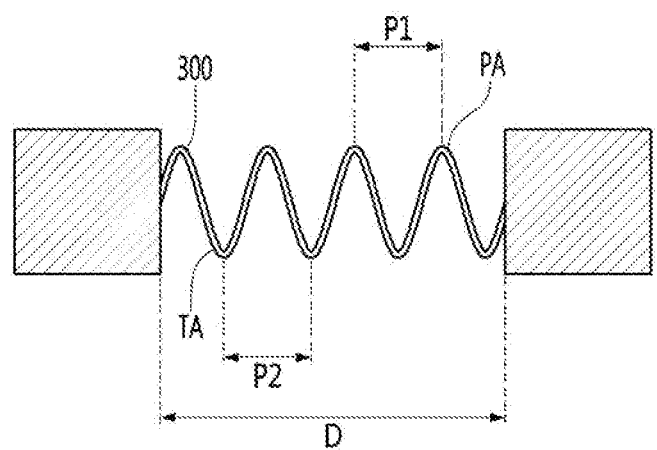

[FIG. 13]
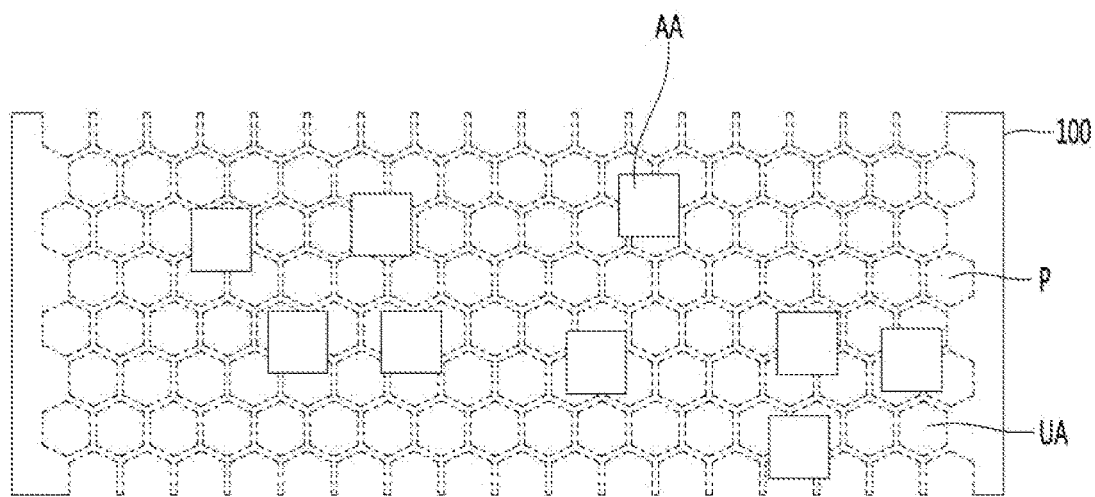
[FIG. 14]
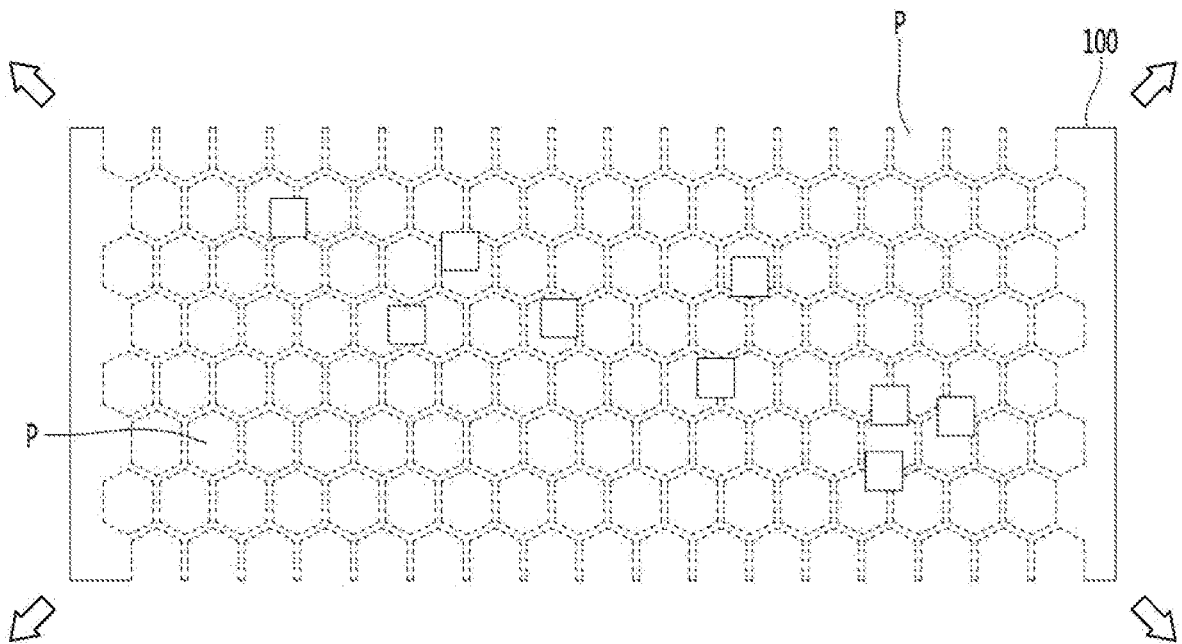

[FIG. 15]
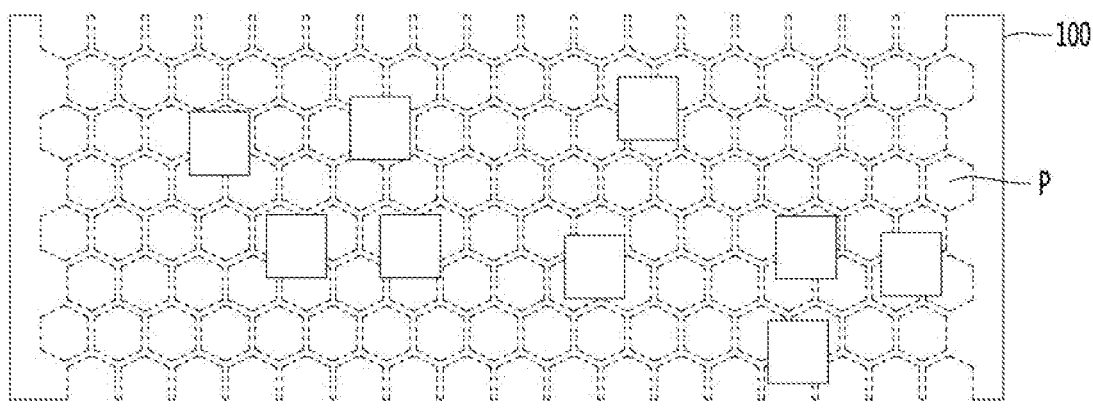
[FIG. 16]
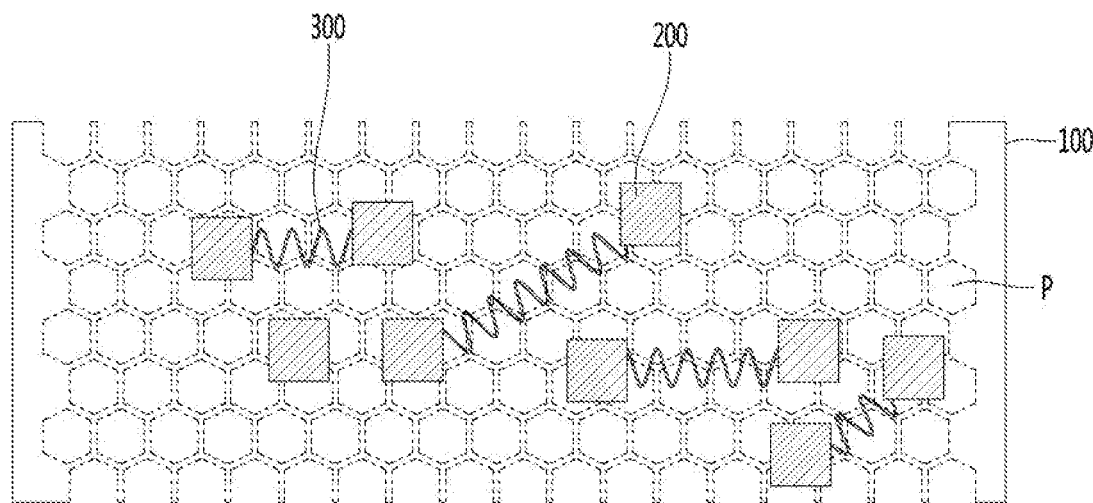

[FIG. 17]
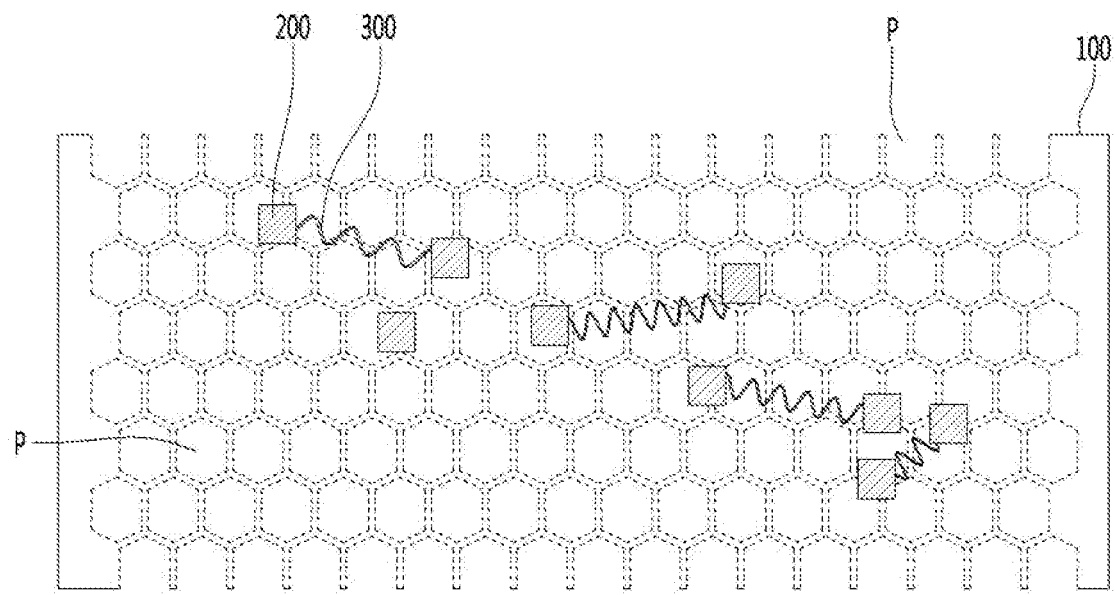
[FIG. 18]
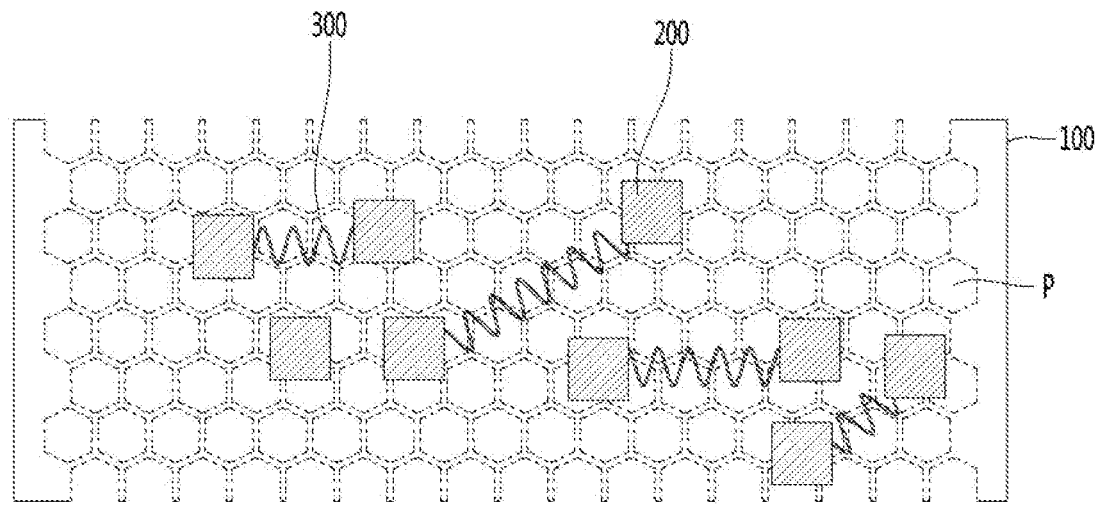

[FIG. 19]
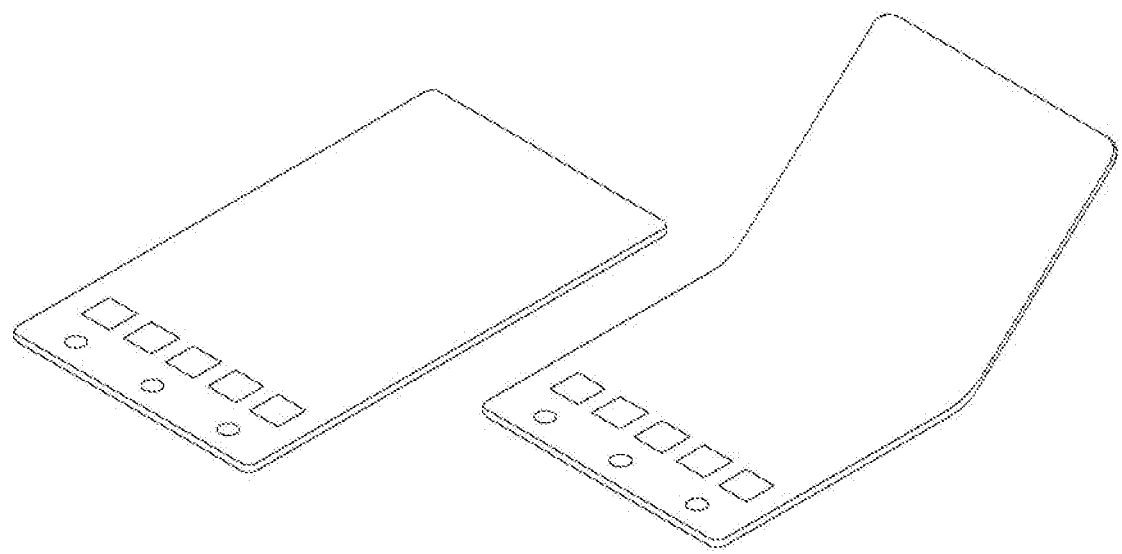
[FIG. 20]
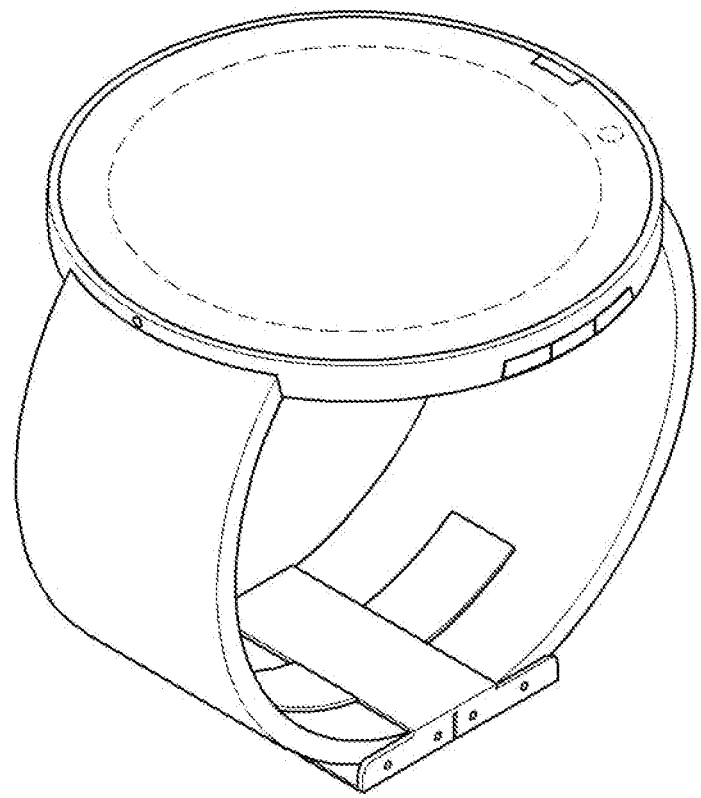

STRETCHABLE CIRCUIT SUBSTRATE

CROSS-REFERENCE TO RELATED PATENT APPLICATIONS

This application is a U.S. National Stage Application under 35 U.S.C. § 371 of PCT Application No. PCT/KR2020/002714, filed Feb. 26, 2020, which claims priority to Korean Patent Application No. 10-2019-0047803, filed Apr. 24, 2019, whose entire disclosures are hereby incorporated by reference.

TECHNICAL FIELD

Embodiments relates to a stretchable circuit board.

BACKGROUND ART

Recently, there is an increasing requirement for a flexible display device capable of easily carrying various applications and displaying an image on a larger screen when being carried.

Such a flexible display is folded or partially bent when being carried or stored, and may be implemented with the display unfolded when displaying images. Accordingly, an image display region may be increased, and a user may easily carry the display.

After the flexible display device is folded or bent, a restoration process of unfolding the flexible display device again may be repeated.

Meanwhile, in order to implement various operations of a display, the flexible device includes various electronic components such as an ASIC, a driving chip, and a multilayer ceramic capacitor (MLCC), and a circuit board on which a plurality of wirings connecting them are formed.

In case of such a circuit board, stress generated when the flexible device is folded or bent, or stretched or restored in one direction affects a soldering area or a bonding area of the circuit board, and the electronic components bonded to the circuit board are de-filmed, and thus reliability of the flexible display device may be deteriorated.

Therefore, there is a need for a stretchable circuit board having a new structure in which the electronic components formed on the circuit board are not de-filmed when bending or folding.

DISCLOSURE

Technical Problem

An embodiment relates to a stretchable circuit board capable of preventing de-filming of an electronic component bonded to a circuit board.

Technical Solution

A stretchable circuit board according to an embodiment includes: a substrate including one surface and the other surface opposite to the one surface; an electronic component disposed on the one surface of the substrate; and a wiring electrode disposed on the one surface of the substrate and connecting the electronic component, wherein the substrate includes an effective area in which the electronic component is formed and an ineffective area other than the effective area, the substrate is formed with a pattern part passing through the one surface and the other surface of the substrate, and the pattern part is formed in the ineffective area.

Advantageous Effects

In a stretchable circuit board according to an embodiment, when a circuit board is stretched in one direction, it is possible to prevent adhesion of an electronic component of the circuit board from being deteriorated.

That is, when the circuit board is stretched in one direction, a pattern part formed in an ineffective area of a substrate is stretched together to prevent an effective area from being stretched, and thus it is possible to prevent an adhesive member disposed on the effective area from being de-filmed by stretching.

Accordingly, the circuit board according to the embodiment may improve reliability of the circuit board and a display device including the same by preventing a deterioration in adhesion of the electronic component.

In addition, when the substrate is stretched and restored, a wiring electrode may also be stretched and restored by forming the wiring electrode connecting the electronic component in a curved shape including a peak and a trough, and thus it is possible to prevent the wiring electrode on the ineffective area from being damaged or deformed by stretching.

DESCRIPTION OF DRAWINGS

FIG. 1 is a view illustrating a perspective view of a flexible display device according to an embodiment.

FIGS. 2 and 3 are views illustrating cross-sectional views of a circuit board before and after stretching according to an embodiment.

FIGS. 4 to 6 are views illustrating a top view for describing a modified example of a circuit board according to a first embodiment.

FIGS. 7 to 9 are top views illustrating electronic components and wiring electrodes disposed on the circuit board according to the first embodiment.

FIGS. 10 to 12 are enlarged views illustrating wiring electrodes disposed on the circuit board according to the first embodiment.

FIGS. 13 to 15 are views illustrating a top view for describing a modified example of a circuit board according to a second embodiment.

FIGS. 16 to 18 are views illustrating a top view for describing electronic components and wiring electrodes disposed on the circuit board according to the second embodiment.

FIGS. 19 and 20 are views illustrating an application example of a flexible display device to which a circuit board according to an embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a stretchable circuit board according to an embodiment will be described with reference to the drawings.

FIG. 1 is a view illustrating a perspective view of a flexible display device according to an embodiment.

Referring to FIG. 1, a flexible display device 1000 according to an embodiment may include a support substrate 1100, a display panel 1200 disposed on the support substrate 1100, a touch panel 1300 disposed on the display panel 1200.

The support substrate 1100 may support the display panel 1200 and the touch panel 1300. That is, the support substrate 1100 may be a substrate that supports the display panel 1200 and the touch panel 1300.

The support substrate 1100 may include a material such as metal. For example, the support substrate 1100 may include metal, metal alloy, plastic, a composite material (e.g., carbon fiber reinforced plastic, a magnetic or conductive material, a glass fiber reinforced material, etc.), ceramic, sapphire, glass, and the like.

The support substrate 1100 may be flexible. That is, the support substrate 1100 may be folded or bent in one direction. That is, the support substrate 1100 may be a substrate for display applied to the flexible display device.

The display panel 1200 may be disposed above the support substrate 1100.

The display panel 1200 may include a plurality of pixels including a switching thin film transistor, a driving thin film transistor, a power storage device, and an organic light-emitting diode (OLED). In case of the OLED, deposition may be performed at a relatively low temperature, and the OLED may be mainly applied to a flexible display device for reasons such as low power and high luminance. Here, a pixel refers to a minimum unit for displaying an image, and the display panel displays an image through a plurality of pixels.

The display panel may include a substrate, a gate line disposed on the substrate, a data line isolated from the gate line, and a common power line. In general, one pixel may be defined by the gate line, the data line, and the common power line as a boundary.

The substrate may include a material having flexible properties such as a plastic film, and the display panel 1200 may be implemented by disposing an organic light-emitting diode and a pixel circuit on a flexible film.

The touch panel 1300 may be disposed above the display panel 1200. The touch panel 1300 may implement a touch function in the flexible display device, and the touch panel may be omitted in a flexible display device that simply displays an image without the touch function.

The touch panel 1300 may include a substrate and a touch electrode disposed on the substrate. The touch electrode may sense a position of an input device that is touched on the flexible display device using a capacitance type or a resistive film type.

The substrate of the touch panel 1300 may include a material having flexible properties such as a plastic film, and the touch panel 1300 may be implemented by disposing the touch electrode on the flexible film.

Meanwhile, although not shown in the drawings, a cover window protecting the flexible display device may be additionally disposed above the touch panel 1300 or above the display panel 1200 (when the touch panel is omitted).

A stretchable circuit board according to the embodiment may be disposed inside the display panel or the touch panel. In detail, the stretchable circuit board may include an element for driving the display panel or an electronic component for driving the touch panel, and a plurality of wiring electrodes.

The stretchable circuit board described below is applied to the flexible display device and has a structure capable of preventing de-filming of wirings or elements formed on the stretchable circuit board that is stretched and restored together when the display device is bent or folded.

FIGS. 2 and 3 are views illustrating cross-sectional views of a stretchable circuit board according to an embodiment.

Referring to FIG. 2, the stretchable circuit board according to the embodiment may include a substrate 100, an electronic component 200 disposed on the substrate, and a wiring electrode 300 electrically connecting the electronic components 200.

The substrate 100 may be flexible. For example, the substrate 100 may include plastic. In detail, the substrate 100 may include plastic such as polyimide (PI), polyethylene terephthalate (PET), propylene glycol (PPG) polycarbonate (PC), or the like.

In addition, the substrate 100 may include a photoisotropic film. For example, the substrate 100 may include cyclic olefin copolymer (COC), cyclic olefin polymer (COP), photoisotropic polycarbonate (PC), photoisotropic polymethyl methacrylate (PMMA), or the like.

Further, the substrate 100 may be partially bent while having a curved surface. That is, the substrate 100 may partially have a plane and may partially be bent while having a curved surface. In detail, an end portion of the substrate 100 may be bent while having a curved surface or may be bent or crooked while having a surface with a random curvature.

Furthermore, the substrate 100 may be a flexible substrate having flexibility. Also, the substrate 100 may be a curved or bent substrate.

The substrate 100 may include an effective area AA and an ineffective area UA. In detail, the substrate 100 may include the effective area AA defined as an area in which the electronic component 200 is disposed and the ineffective area UA defined as an area other than the effective area AA, for example, an area in which the electronic component is not disposed. The wiring electrode 300 may be disposed on the ineffective area UA.

The electronic component 200 may be disposed on the substrate 100. The electronic component 200 may be disposed on an upper surface of the substrate 100. In detail, the electronic component 200 may be disposed on at least one surface of the substrate 100.

The electronic component 200 may include an element and/or a chip that drives the display panel or the touch panel.

For example, the electronic component may include an active device or a passive device. The active device refers to a device that positively uses non-linear characteristics, and the passive device refers to a device that does not use non-linear characteristics even though both linear and non-linear characteristics are present. The active device may include a transistor, an IC semiconductor chip, and the like, and the passive device may include a capacitor, a resistor, an inductor, and the like. The passive device is mounted on a substrate together with an ordinary semiconductor package in order to increase a signal processing speed of a semiconductor chip which is an active device, perform a filtering function, or the like.

The electronic component 200 may be adhered to one surface of the substrate 100. In detail, an adhesive member 150 is disposed on the substrate 100, and the electronic component 200 may be bonded to the one surface of the substrate 100 through the adhesive member 150.

The adhesive member 150 may include solder paste. The solder paste is an adhesive that fixes the electronic component 200 attached to the substrate 100.

The adhesive member 150 may include a conductive adhesive or a non-conductive adhesive. The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulation resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

The wiring electrode 300 may be disposed on the substrate 100. The wiring electrode 300 may be disposed on the upper surface of the substrate 100. In detail, the wiring electrode 300 may be disposed on the one surface of the substrate 100.

The wiring electrode 300 may be disposed in the ineffective area UA among areas of the substrate 100.

The wiring electrode 300 may electrically connect the electronic components 200 disposed on the one surface of the substrate 100. For example, the wiring electrode 300 may electrically connect a plurality of devices and/or chips to each other. In detail, the wiring electrode 300 may be connected to each of the electronic components 200 through a pad part 350, so that a plurality of electronic components may be electrically connected to each other.

The wiring electrode 300 may be a wiring that transmits an electrical signal and may be formed of a metal material having high electrical conductivity. To this end, the wiring electrode 300 may be formed of at least one metal material selected from among gold (Au), silver (Ag), platinum (Pt), titanium (Ti), tin (Sn), copper (Cu), and zinc (Zn). In addition, the wiring electrode 300 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the wiring electrode 300 may be formed of copper (Cu) having high electrical conductivity and a relatively low cost.

Meanwhile, such a stretchable circuit board may be applied to a flexible display device and may be stretched in one direction when the stretchable circuit board is also bent or folded while being stretched in one direction when the flexible display device is bent or folded.

Referring to FIG. 3, the stretchable circuit board may be stretched while being bent in one direction. That is, the stretchable circuit board may be stretched in the same direction in which the flexible display device is bent and stretched.

In this case, while the substrate 100 is stretched, tensile stress may be generated in the substrate. The adhesive member 150 disposed on the substrate 100 may be de-filmed from the substrate 100 by the stress.

Accordingly, the adhesion of the electronic component 200 adhered through the adhesive member 150 may be deteriorated, and thus reliability of the circuit board and the flexible display device including the same may decrease.

Accordingly, a plurality of pattern parts P may be formed on the substrate 100. In detail, the plurality of pattern parts P may be formed in the ineffective area UA of the substrate 100. The stress generated when the substrate is stretched is alleviated by the pattern parts P, and accordingly, it is possible to prevent the adhesive member 150 from being de-filmed.

Meanwhile, FIG. 3 illustrates that the stretchable circuit board is bent so that surfaces on which the adhesive member is not disposed face each other, but the embodiment is not limited thereto, and the stretchable circuit board is bent so that surfaces on which the adhesive member is disposed face each other, and accordingly, the adhesive member 150 may be de-filmed from the substrate 100 due to contraction stress.

Hereinafter, the pattern part P formed on the substrate 100 will be described in detail, focusing on the fact that the stretchable circuit board is bent so that the surfaces on which the adhesive member is not disposed face each other.

FIGS. 4 to 6 are views illustrating a top view for describing a modified example of a stretchable circuit board according to a first embodiment.

FIG. 4 is a view illustrating a substrate of the stretchable circuit board before stretching, FIG. 5 is a view illustrating the substrate of the stretchable circuit board after stretching, and FIG. 6 a view illustrating the substrate of the stretchable circuit board after restoration.

Referring to FIG. 4, the substrate 100 may include a plurality of pattern parts P. The pattern part P may be formed in an area on which the electronic component 200 is not disposed, that is, in an ineffective area UA of the substrate.

In addition, the pattern part P is not formed in an effective area AA of the substrate on which the electronic component 200 is disposed.

The pattern part P may be formed in the entire area of the ineffective area UA of the substrate 100 or in a partial area of the ineffective area UA.

The pattern part P may be a hole formed passing through the substrate 100. In detail, the pattern part P may be formed passing through one surface and the other surface of the substrate 100.

The pattern part P formed passing through the one surface and the other surface of the substrate 100 may be formed to extend in one direction. In detail, the pattern part P may be formed to extend in a direction different from a direction in which the wiring electrode 300 extends. In detail, the pattern part P may extend in a direction perpendicular to the direction in which the wiring electrode 300 extends. That is, the pattern part P may be formed to extend in a direction perpendicular to a longitudinal direction of the wiring electrode 300.

In addition, the pattern part P may be formed to extend in a width direction of the substrate 100. In detail, the substrate 100 may have a long width having a length in a long direction and a short width having a length in a short direction. The pattern part P may be formed to extend in a direction of the short width having the length in the short direction of the substrate.

In addition, the pattern part P may be formed to extend in a direction perpendicular to a tensile direction of the substrate 100. That is, when the substrate 100 is stretched in one direction, the pattern part P may be formed to extend in a direction perpendicular to the one direction.

That is, the pattern part P may have a long width and a short width, and the long width may extend in a direction perpendicular to the longitudinal direction of the wiring electrode, a long direction of the substrate, or a direction in which the substrate is stretched.

The pattern part P may be formed to have a curved surface. In detail, the pattern part P may be formed in a shape having a curved surface such as an elliptical shape, a hemispherical shape, a circular shape, or the like.

However, the embodiment is not limited thereto, and the pattern part P may be formed in a polygonal shape such as a triangle, a square, or the like.

FIGS. 5 and 6, the substrate 100 may be restored after being stretched in one direction.

For example, referring to FIG. 5, the substrate 100 may be stretched in the long direction of the substrate 100. As the substrate 100 is stretched in one direction, a size of the pattern part P may be changed. In detail, as the substrate 100 is stretched in one direction, a size of the short width of the pattern part P may be increased as much as the substrate is stretched.

In addition, referring to FIG. 6, while the substrate 100 is restored, the size of the short width of the pattern part P may also be restored.

That is, the size of the short width of the pattern part P formed in the ineffective area UA of the substrate may be increased in the tensile direction and then restored.

Therefore, when the substrate 100 is stretched in one direction, it is possible to minimize an occurrence of tensile stress in the effective area AA of the substrate in which the electronic component 200 is disposed. That is, when the pattern part P formed in the ineffective area AA of the substrate serves as a spring, and the substrate 100 is stretched in one direction, it may be stretched in the same direction as the tensile direction.

Therefore, when the substrate 100 is stretched in one direction as shown in FIG. 5, only the ineffective area of the substrate is stretched, and the effective area of the substrate may be prevented from being stretched, and thus it is possible to prevent the adhesive member disposed on the effective area of the substrate from being de-filmed.

Accordingly, as the substrate 100 is stretched, it is possible to prevent a deterioration in adhesion of the electronic component due to the de-filming of the adhesive member, thereby improving the reliability of the circuit board and the display device including the same.

Hereinafter, electronic components and wiring electrodes disposed on the substrate 100 on which the pattern part is formed will be described in detail.

FIGS. 7 to 9 are views illustrating electronic components and wiring electrodes disposed on the stretchable circuit board according to the first embodiment described above.

FIG. 7 is a view illustrating the stretchable circuit board before stretching, FIG. 8 is a view illustrating the stretchable circuit board after stretching, and FIG. 9 is a view illustrating the stretchable circuit board after restoration.

Referring to FIG. 7, the electronic component 200 may be disposed on the effective area AA of the substrate 100, and the wiring electrode 300 may be formed on the ineffective area UA of the substrate.

That is, the electronic component 200 may be disposed on the effective area AA of the substrate 100 in which the pattern part P is not formed, and the wiring electrode 300 may be formed on the ineffective area UA of the substrate in which the pattern part P is formed.

Referring to FIGS. 8 and 9, as described above, the effective area AA of the substrate 100 on which the electronic component 200 is disposed may be prevented from being stretched together when the substrate 100 is stretched, and the ineffective area UA of the substrate 100 on which the wiring electrode 300 is disposed may be stretched together as much as the substrate is stretched when the substrate 100 is stretched.

Accordingly, in the effective area AA of the substrate 100 on which the electronic component 200 is disposed, the adhesive member adhering to the substrate 100 and the electronic component 200 may be prevented from being de-filmed, and accordingly, even after the substrate 100 is stretched and restored, the adhesion between the substrate 100 and the electronic component 200 may be maintained.

FIGS. 10 to 12 are enlarged views illustrating wiring electrodes disposed on the circuit board according to the first embodiment.

FIG. 10 is a view illustrating a wiring electrode before stretching, FIG. 11 is a view illustrating the wiring electrode after stretching, and FIG. 12 is a view illustrating the wiring electrode after restoration.

Referring to FIG. 10, the wiring electrode 300 disposed on the ineffective area UA of the substrate 100 may be disposed the substrate 100 to electrically connect at least two or more electronic components 200.

A length of the wiring electrode 300 may be greater than a distance D between the electronic components 200 connected to the wiring electrode 300.

The wiring electrode 300 may have a curved shape. That is, a plurality of peak areas PA and a trough area TA between the peak areas may be included between one end and the other end of the wiring electrode.

In addition, the peak area and the trough area may be alternately disposed. Accordingly, the length of the wiring electrode 300 may be greater than the distance D between the electronic components 200 connected to the wiring electrode 300.

Referring to FIGS. 11 and 12, when the substrate 100 is stretched in one direction, the wiring electrode 300 may also be stretched. In addition, when the substrate 100 is restored, the wiring electrode 300 may also be restored.

In the wiring electrode, when the substrate 100 is stretched in one direction, a pitch P1 in the peak area and a pitch P2 in the trough area of the wiring electrode may be changed.

For example, when a distance D1 between the electronic components 200 before the substrate is stretched is defined as X, and a distance D2 between the electronic components 200 after the substrate is stretched is defined as X', a size of X' may be increased as much as the substrate is stretched with respect to a size of X.

In this case, the pitch P1 of the peak area and the pitch P2 of the trough area of the wiring electrode may also be increased. In detail, when the pitch P1 of an adjacent peak area and the pitch P2 of an adjacent trough area before the substrate is stretched are defined as Y, and the pitch P1 of the adjacent peak area and the pitch P2 of the adjacent trough area after the substrate is stretched are defined as Y', a size of Y' may be greater than a size of Y.

In detail, the size of Y' may exceed 1 times and 1.5 times or less with respect to the size of Y. When the size of Y' is 1 times or less the size of Y, the wiring electrode is not stretched together when the substrate is stretched and restored, and thus it may be deformed or damaged by tensile stress. In addition, when the size of Y' exceeds 1.5 times the size of Y, a size of the wiring electrode after the substrate 100 is restored is different from a size of the wiring electrode before the substrate 100 is stretched, and thus tensile force of the wiring electrode may be reduced while the substrate is repeatedly stretched.

Accordingly, when the pitch P1 of the peak area and the pitch P2 of the trough area of the wiring electrode are a Y value before stretching, the pitches change to a Y' value after stretching, and the pitches are restored to the Y value after restoration.

In the stretchable circuit board according to the embodiment, when the circuit board is stretched in one direction, it is possible to prevent the adhesion of the electronic component of the circuit board from being deteriorated.

That is, when the circuit board is stretched in one direction, the pattern part formed in the ineffective area of the substrate is stretched together to prevent the effective area from being stretched, and thus it is possible to prevent the adhesive member disposed on the effective area from being de-filmed by stretching.

Accordingly, the circuit board according to the embodiment may improve reliability of the circuit board and a display device including the same by preventing a deterioration in adhesion of the electronic component.

In addition, when the substrate is stretched and restored, the wiring electrode may also be stretched and restored by forming the wiring electrode connecting the electronic component in a curved shape including a peak and a trough, and thus it is possible to prevent the wiring electrode on the ineffective area from being damaged or deformed by stretching.

Hereinafter, a substrate and a circuit board according to a second embodiment will be described with reference to FIGS. 13 to 18.

FIGS. 13 to 15 are views illustrating a top view for describing a modified example of a stretchable circuit board according to the second embodiment.

FIG. 13 is a view illustrating a substrate of the stretchable circuit board before stretching, FIG. 14 is a view illustrating the substrate of the stretchable circuit board after stretching, and FIG. 15 is a view illustrating the substrate of the stretchable circuit board after restoration.

Referring to FIG. 13, the substrate 100 may include a plurality of pattern parts P. The pattern part P may be formed in an area in which the electronic component 200 is not disposed, that is, in an ineffective area UA of the substrate.

In addition, the pattern part P is not formed in an effective area AA of the substrate in which the electronic component 200 is disposed.

The pattern part P may be a hole formed passing through the substrate 100. In detail, the pattern part P may be formed passing through one surface and the other surface of the substrate 100.

The pattern part P formed passing through the one surface and the other surface of the substrate 100 may be formed in a polygonal shape. For example, the pattern part P may be formed in a honeycomb shape.

Referring to FIGS. 14 and 15, the substrate 100 may be restored after being stretched in a plurality of directions.

For example, referring to FIG. 14, the substrate 100 may be stretched in one direction and another direction. As an example, the substrate 100 may include first, second, third, and fourth corner areas, and the substrate may be stretched in a direction parallel to the first corner area and the fourth corner area facing each other, and the substrate may be stretched in a direction parallel to the second corner area and the third corner area facing each other.

That is, the substrate 100 may be stretched in at least two directions having different directions.

As the substrate 100 is stretched in one direction and the other direction, a size of the pattern part P may be changed. In detail, as the substrate 100 is stretched in one direction and the other direction, the pattern part P may maintain a honeycomb shape and its size may be increased.

In addition, referring to FIG. 15, while the substrate 100 is restored, the size of the pattern part P may also be restored.

That is, the size of the pattern part P formed in the ineffective area UA of the substrate may be increased in a plurality of tensile directions and then restored.

Therefore, when the substrate 100 is stretched in one direction and the other direction, it is possible to minimize an occurrence of tensile stress in the effective area AA of the substrate in which the electronic component 200 is disposed. That is, when the pattern part P formed in the ineffective area UA of the substrate serves as a spring, and the substrate 100 is stretched in one direction and the other direction, it may be stretched in the same direction as the tensile direction.

Therefore, when the substrate 100 is stretched in one direction and the other direction as shown in FIG. 14, only the ineffective area of the substrate is stretched, and the effective area of the substrate may be prevented from being stretched, and thus it is possible to prevent the adhesive member disposed on the effective area of the substrate from being de-filmed.

Accordingly, as the substrate 100 is stretched, it is possible to prevent a deterioration in adhesion of the electronic component due to the de-filming of the adhesive member, thereby improving the reliability of the circuit board and the display device including the same.

Hereinafter, electronic components and wiring electrodes disposed on the substrate 100 on which the pattern part is formed will be described in detail.

FIGS. 16 to 18 are views illustrating electronic components and wiring electrodes disposed on the stretchable circuit board according to the second embodiment described above.

FIG. 16 is a view illustrating the stretchable circuit board before stretching, FIG. 17 is a view illustrating the stretchable circuit board after stretching, and FIG. 18 is a view illustrating the stretchable circuit board after restoration.

Referring to FIG. 16, the electronic component 200 is disposed on the effective area AA of the substrate 100, and the wiring electrode 300 may be formed on the ineffective area UA of the substrate.

That is, the electronic component 200 may be disposed on the effective area AA of the substrate 100 in which the pattern part P is not formed, and the wiring electrode 300 may be formed on the ineffective area UA of the substrate in which the pattern part P is formed.

Referring to FIGS. 17 and 18, as described above, the effective area AA of the substrate 100 on which the electronic component 200 is disposed may be prevented from being stretched together when the substrate 100 is stretched, and the ineffective area UA of the substrate 100 on which the wiring electrode 300 is disposed may be stretched together as much as the substrate is stretched when the substrate 100 is stretched.

Accordingly, in the effective area AA of the substrate 100 on which the electronic component 200 is disposed, the adhesive member adhering to the substrate 100 and the electronic component 200 may be prevented from being de-filmed, and accordingly, even after the substrate 100 is stretched and restored, the adhesion between the substrate 100 and the electronic component 200 may be maintained.

FIGS. 19 and 20 are views for describing an example in which a circuit board according to embodiments is applied.

Referring to FIG. 19, the circuit board according to the embodiments may be applied to a flexible display device that displays a display.

Further, referring to FIG. 20, the circuit board according to the embodiments may be applied to a wearable device applied to a human body.

For example, the circuit board according to the embodiments may be applied to a flexible display device such as a mobile phone, a tablet, and the like.

The circuit board may be applied to the flexible display device such as the mobile phone, the tablet, and the like that are flexible, bent, or folded The circuit board is applied to the flexible display device such as the mobile phone, the tablet, and the like that are flexible, bent or folded, and the reliability of the flexible display device may be improved by improving the folding reliability in a display device that is repeatedly folded or restored.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Thus, it should be construed that the contents related to such combination and modification are included in the scope of the present invention.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A stretchable circuit board comprising: a substrate including one surface and the other surface opposite to the one surface; an electronic component disposed on the one surface of the substrate; and a wiring electrode disposed on the one surface of the substrate and connecting the electronic component, wherein the substrate includes an effective area in which the electronic component is formed and an ineffective area other than the effective area, the substrate is formed with a pattern part passing through the one surface and the other surface of the substrate, the pattern part is formed in the ineffective area, the pattern part includes a long width and a short width, the pattern part includes a plurality of holes passing through the one surface and the other surface of the substrate, the long width of the pattern part extends in a direction perpendicular to a tensile direction of the substrate, and wherein the pattern part includes the long width and the short width, and a length of the short width in the pattern part is increased while the substrate is stretched.

2. The stretchable circuit board of claim 1, wherein
the pattern part extends in a direction perpendicular to a longitudinal direction in which the wiring electrode extends.

3. The stretchable circuit board of claim 1, wherein
the substrate includes a long width having a length in a long direction and a short width having a length in a short direction, and
the pattern part extends in a direction of the short width.

4. The stretchable circuit board of claim 1, wherein a length of the wiring electrode is longer than a distance between the elements.

5. The stretchable circuit board of claim 4, wherein the length of the wiring electrode is increased while the substrate is stretched.

6. The stretchable circuit board of claim 4, wherein the wiring electrode includes a curve.

7. The stretchable circuit board of claim 4, wherein the substrate is stretched in one direction,
the wiring electrode includes a plurality of peaks and troughs between the peaks, and
when a pitch between adjacent peaks before stretching of the substrate is defined as Y and a pitch between adjacent peaks after stretching of the substrate is defined as Y',
a size of Y' is greater than 1 times and 1.5 times or less with respect to a size of Y.

8. The stretchable circuit board of claim 1, wherein the wiring electrode is disposed on the ineffective area.

9. The stretchable circuit board of claim 1, wherein
the long width of the pattern part extends in a direction perpendicular to a longitudinal direction of the wiring electrode.

10. The stretchable circuit board of claim 1, further comprising
an adhesive member disposed between the substrate and the electronic component.

11. The stretchable circuit board of claim 10, wherein the substrate is bent so that surfaces on which the adhesive member is not disposed face each other.

12. The stretchable circuit board of claim 1, wherein pattern part is formed in a polygonal shape.

13. The stretchable circuit board of claim 12, wherein the substrate is stretched in at least two directions.

14. The stretchable circuit board of claim 13, wherein the substrate includes a first corner area, a second corner area, a third corner area, and a fourth corner area, the first corner area and the fourth corner area face each other in a diagonal direction of the substrate,
the second corner area and the third corner area face each other in the diagonal direction of the substrate, and
the substrate is stretched in a first direction parallel to a direction in which the first corner area and the fourth corner area face each other and in a second direction parallel to a direction in which the second corner area and the third corner area face each other.

15. The stretchable circuit board of claim 14, wherein the pattern part includes a honeycomb shape.

16. The stretchable circuit board of claim 15, wherein a size of the pattern part increases while the substrate is stretched in the first direction and second direction and the pattern part maintains the honeycomb shape.

17. A flexible display device comprising: a support substrate; and
a panel including at least one of a display panel and a touch panel disposed on the support substrate, wherein the panel includes a stretchable circuit board, and the stretchable circuit board includes: a substrate including one surface and the other surface opposite to the one surface; an electronic component disposed on the one surface of the substrate; and a wiring electrode disposed on the one surface of the substrate and connecting the electronic component, wherein the substrate includes an effective area in which the electronic component is formed and an ineffective area other than the effective area, the substrate is formed with a pattern part passing through the one surface and the other surface of the substrate, the pattern part is formed in the ineffective area, the pattern part includes a plurality of holes passing through the one surface and the other surface of the substrate, the pattern part extends in a direction perpendicular to a tensile direction of the substrate, and wherein the pattern part includes the long width and the short width, and a length of the short width in the pattern part is increased while the substrate is stretched.

18. The flexible display device of claim 17, wherein the support substrate and the panel are bent in one direction, and
the stretchable circuit board is bent in the same direction as the one direction.

19. The flexible display device of claim 17, further comprising
an adhesive member disposed between the substrate and the electronic component,
wherein the substrate is bent so that surfaces on which the adhesive member is not disposed face each other.

* * * * *